(12) United States Patent
Sonoda et al.

(10) Patent No.: US 8,668,157 B2
(45) Date of Patent: Mar. 11, 2014

(54) METHOD OF RECOVERING FILM-FORMING MATERIAL

(75) Inventors: Tohru Sonoda, Osaka (JP); Shinichi Kawato, Osaka (JP); Satoshi Inoue, Osaka (JP); Satoshi Hashimoto, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/996,515

(22) PCT Filed: Dec. 16, 2011

(86) PCT No.: PCT/JP2011/079151
§ 371 (c)(1),
(2), (4) Date: Jun. 20, 2013

(87) PCT Pub. No.: WO2012/086535
PCT Pub. Date: Jun. 28, 2012

(65) Prior Publication Data
US 2013/0292501 A1    Nov. 7, 2013

(30) Foreign Application Priority Data

Dec. 23, 2010 (JP) ................. 2010-286821

(51) Int. Cl.
*B02C 19/00* (2006.01)
*B24B 1/00* (2006.01)
(52) U.S. Cl.
USPC ............................ 241/24.14; 241/25; 451/38

(58) Field of Classification Search
USPC .......... 241/25, 30, 24.14, 79.1, 101.2; 451/38, 451/75, 88
See application file for complete search history.

(56) References Cited

FOREIGN PATENT DOCUMENTS

| JP | 10-15826 A | 1/1998 |
|----|------------|--------|
| JP | 10-168559 A | 6/1998 |
| JP | 2002-190389 A | 7/2002 |
| JP | 2002-222628 A | 8/2002 |
| JP | 2002-292346 A | 10/2002 |
| JP | 2007-126727 A | 5/2007 |
| JP | 2007-154046 A | 6/2007 |
| JP | 2008-88465 A | 4/2008 |
| JP | 2008-127642 A | 6/2008 |
| JP | 2008-223102 A | 9/2008 |

OTHER PUBLICATIONS

International Search Report received for PCT Patent Application No. PCT/JP2011/079151, mailed on Jan. 24, 2012, 5 pages (3 pages of English Translation and 2 pages of Search Report).

*Primary Examiner* — Mark Rosenbaum
(74) *Attorney, Agent, or Firm* — Morrison & Foerster LLP

(57) ABSTRACT

A layer (71), made from a material that is attracted by a magnet, is formed in at least part of a chamber component (70), which at least part makes in contact with a film forming material. A method for collecting a film forming material includes the steps of: (a) exfoliating an attachment (22) which has attached to a surface of the chamber component (70); and (b) collecting the attachment (22) by separating a fragment of the layer (71), which fragment has been exfoliated in the step (a), while causing the fragment to be attracted by a magnet (202a).

10 Claims, 9 Drawing Sheets

METHOD OF RECOVERING FILM-FORMING MATERIAL

CROSS REFERENCE TO RELATED APPLICATIONS

This is a U.S. National Phase patent application of PCT/JP2011/079151, filed Dec. 16, 2011, which claims priority to Japanese patent application no. 2010-286821, filed Dec. 23, 2010, each of which is hereby incorporated by reference in the present disclosure in its entirety.

TECHNICAL FIELD

The present invention relates to a method for collecting a film forming material by exfoliating a film forming material which has attached to a surface of a film forming jig provided in a film forming chamber of a vacuum film forming device.

BACKGROUND ART

Recently, electronics devices, particularly, devices associated with information have been increasingly produced in the society which is changing to a mass production and mass disposal society. Examples of main components of the electronics devices encompass a semiconductor, a flat display panel such as a liquid crystal panel, a solar battery, a semiconductor device, and a memory.

The electronics devices are produced by use of a vacuum film forming device which employs a vacuum film forming method such as a sputtering method, a vacuum vapor deposition method, or an ion plating method. A film forming material of rare metal is frequently used.

Further, recently, flat panel displays have been in widespread use for various commodities and in fields. Therefore, further increase in size, high-definition, and low power consumption of the flat panel displays have been required.

Under the circumstances, an organic EL display device including organic EL elements which utilize electroluminescence (hereinafter referred to as "EL") of an organic material has gained great attention. This is because the organic EL display device is a solid-state flat panel display having advantages such as low voltage driving, high-speed response, and self-luminescence.

The organic EL display device is configured, for example, so that organic EL elements are connected to respective TFTs (thin film transistors) on a substrate such as a glass substrate.

Each of the organic EL elements is a light emitting element which can emit high luminance light by being driven by a low-voltage direct current. The organic EL elements have a layer stack structure in which respective first electrodes, an organic EL layer, and a second electrode are stacked in this order. The first electrodes are connected to the respective TFTs.

The organic EL layer provided between the first electrodes and the second electrode is an organic layer in which layers, such as a hole injecting layer, a hole transporting layer, an electron blocking layer, a luminescent layer, a hole blocking layer, an electron transporting layer, and an electron injecting layer, are stacked.

A full-color organic EL display device is generally configured so that red (R) organic EL elements, green (G) organic EL elements, and blue (B) organic EL elements, which serve as respective sub-pixels, are arranged on a substrate. The full-color organic EL display device displays an image by causing, by use of TFTs, the red (R) organic EL elements, the green (G) organic EL elements, and the blue (B) organic EL elements to selectively emit light having a desired luminance.

The organic EL elements of a light emitting section of the full-color organic EL display device are generally formed by carrying out vapor deposition of organic films. During production of the full-color organic EL display device, luminescent layers made from respective organic light emitting materials that emit red light, green light, and blue light, respectively, are formed in a predetermined pattern for the respective organic EL elements that are the light emitting elements.

A film having the predetermined pattern can be formed by means of vapor deposition, for example, by a vacuum vapor deposition method which employs a mask called "shadow mask" for vapor deposition, an inkjet method, or a laser transfer method.

Among the methods, the vacuum vapor deposition method is most popularly employed these days.

According to the vacuum vapor deposition method, vapor deposition of a vapor deposition material is carried out on a film formation substrate on which a film is to be formed, by heating and subliming the vapor deposition material in a high vacuum by use of a vapor deposition source (i) in which the vapor deposition material is to be put and (ii) which is called "crucible" or "boat".

Specifically, a film having a desired pattern can be formed by carrying out, via openings formed in the mask, vapor deposition of the vapor deposition material which has been outputted as vapor deposition particles from the vapor deposition source, in a vacuum chamber of a vacuum vapor deposition device.

Thus, the organic EL elements of the light emitting section of the full-color organic EL display device are formed by the vapor deposition of the organic films.

According to the vacuum vapor deposition method, as early described, the vapor deposition particles obtained by heating and subliming the vapor deposition material are outputted from the vapor deposition source. Therefore, scattered vapor deposition particles attach to components other than the film formation substrate such as a TFT substrate.

The vacuum chamber of the vacuum vapor deposition device includes the components such as a vapor deposition-proof plate and a shutter.

The vapor deposition material which has attached to the components, that is, the vapor deposition particles which have attached to the film formation substrate such as the TFT substrate are waste unless the vapor deposition particles are collected, though an organic material for the organic films is expensive.

Actually, it is impossible to recycle an organic material which has attached to a vapor deposition-proof plate and other components in a vacuum chamber of an apparatus that is used for producing large numbers of organic EL display devices. Therefore, a material utilization rate is low.

What is meant by the material utilization rate is how much a vapor deposition material is actually used to form organic films.

The material utilization rate is increased by collecting and recycling the vapor deposition material which has attached to the components other than the film formation substrate.

As a method for increasing the material utilization rate, for example, Patent Literature 1 discloses a method for collecting a vapor deposition material which has attached to a cell shutter by (i) heating and vaporizing the vapor deposition material and (ii) cooling the resultant vapor in a shroud in which a coolant is circulated.

Patent Literature 2 discloses a method for collecting a vapor deposition material which has attached to a shutter plate by (i) melting the vapor deposition material by use of a heater included in a shutter and (ii) causing the resultant molten to drop into a vapor deposition source.

Patent Literature 3 discloses a method for collecting, in a crucible, a vapor deposition material which has attached to a lower surface of a cell shutter by heating the cell shutter by use of a heater so that the vapor deposition material is vaporized.

Patent Literature 4 discloses a method for collecting a vapor deposition material which has accumulated on a blocking wall which is included in a vapor deposition material collector that has a vapor exhaust port. The vapor deposition material collector is provided so as to cover a vapor exit. The method is carried out with respect to the vapor deposition material collector which has been taken out after vapor deposition. The vapor deposition is carried out while a scattering angle of a vapor flow from a vapor deposition source toward a substrate to be processed is being controlled.

Patent Literature 5 discloses that (i) members such as a shutter in a chamber, on which members an organic material is to be accumulated, are made from an inert material which does not denaturalize the organic material and (ii) the organic material which has accumulated on the members is collected.

Patent Literature 6 discloses a method for collecting a material which has attached to a film forming jig by injecting water to the material by use of a water jet.

CITATION LIST

Patent Literatures

Patent Literature 1
Japanese Patent Application Publication, Tokukaihei, No. 10-168559 A (Publication Date: Jun. 23, 1998)
Patent Literature 2
Japanese Patent Application Publication, Tokukai, No. 2008-127642 A (Publication Date: Jun. 5, 2008)
Patent Literature 3
Japanese Patent Application Publication, Tokukai, No. 2008-88465 A (Publication Date: Apr. 17, 2008)
Patent Literature 4
Japanese Patent Application Publication, Tokukai, No. 2008-223102 A (Publication Date: Sep. 25, 2008)
Patent Literature 5
Japanese Patent Application Publication, Tokukai, No. 2002-190389 A (Publication Date: Jul. 5, 2002)
Patent Literature 6
Japanese Patent Application Publication, Tokukai, No. 2002-292346 A (Publication Date: Oct. 8, 2002)

SUMMARY OF INVENTION

Technical Problem

However, the methods disclosed in Patent Literatures 1 through 3 have a problem that a vapor deposition material which has attached to members other than a shutter cannot be collected.

In a mass production process, a plurality of substrates are consecutively subjected to a vapor deposition process with a stable vapor deposition rate. Therefore, the vapor deposition process is carried out for almost all time periods except a short time period such as (i) a time period during which substrates are taken in and out of a chamber and (ii) a time period during which a mask for vapor deposition is attached to a substrate. That is, the shutter is open for the almost all time periods.

Accordingly, in an actual mass production process, an amount of vapor deposition material which attaches to the members other than the shutter is large. It is therefore impossible to efficiently collect and recycle a vapor deposition material just by collecting a vapor deposition material which has attached to the shutter.

Further, a vapor deposition material is possibly deteriorated by heat generated for collection of the vapor deposition material.

The method disclosed in Patent Literature 4 has a problem that a vapor deposition material, which has attached to members other than the blocking wall and the substrate to be processed, cannot be collected.

Patent Literature 5 does not disclose a concrete method for collecting the organic material which has accumulated on the members such as the shutter in the chamber, though discloses collecting the organic material.

The method disclosed in Patent Literature 6 cannot be applied to a vapor deposition material which is easily denaturalized by water. Further, even water will damage the film forming jig or exfoliate part of the film forming jig due to a pressure of the water. The part, which is exfoliated, is immixed with an exfoliated vapor deposition material. However, Patent Literature 6 does not describe such an impurity which is immixed with the exfoliated vapor deposition material.

As such, the conventional methods could not efficiently collect a film forming material at low cost.

The present invention was made in view of the problems, and an object of the present invention is to provide a method for efficiently collecting a film forming material at low cost.

Solution to Problem

In order to attain the object, a method of the present invention for collecting a film forming material is arranged to be a method for collecting a film forming material by exfoliating a film forming material which has attached to a surface of a film forming jig provided in a film forming chamber of a vacuum film forming device, a layer, made from a material that is attracted by a magnet, being formed on at least part of the film forming jig, the at least part making in contact with the film forming material, the method including the steps of: (a) exfoliating the film forming material from the surface of the film forming jig; and (b) collecting the film forming material, by separating a fragment of the layer, which fragment has been exfoliated together with the film forming material in the step (a), while causing the fragment to be attracted by a magnet.

Further, in order to attain the object, the method of the present invention is arranged to be a method for collecting a film forming material by exfoliating a film forming material which has attached to a surface of a film forming jig provided in a film forming chamber of a vacuum film forming device, the method including the steps of: (a) exfoliating the film forming material from the surface of the film forming jig by use of a chip-off tool having at least part which (i) is made from a material that is attracted by a magnet and (ii) makes in contact with the film forming material; and (b) collecting the film forming material by separating a fragment of the chip-off tool from the film forming material, while causing the fragment to be attracted by the magnet, the fragment being (i) made from the material that is attracted by the magnet and (ii) mixed in the film forming material which has been exfoliated in the step (a).

In order to collect and recycle a film forming material which has attached to a surface of a film forming jig, it is necessary to exfoliate the film forming material from the surface of the film forming jig.

In a case where the film forming material is exfoliated from the surface of the film forming jig, part of the surface of the film forming jig, and part of a surface of a chip-off tool are exfoliated together with the film forming material, and mixed in the film forming material which has been exfoliated.

However, each of the methods of the present invention employs (i) the film forming jig having the at least part on which the layer, made from the material that is attracted by a magnet, is formed, the at least part making in contact with the film forming material or (ii) the chip-off tool having the at least part which is made from the material that is attracted by a magnet, the at least part making in contact with the film forming material. The fragment made from the material that is attracted by a magnet, which fragment has been exfoliated together with the film forming material in the step (a), is attracted by the magnet to be separated from the film forming material.

Therefore, according to the methods, the film forming material can be efficiently collected at low cost.

Further, according to the methods, no complicated process such as (i) cleaning with a liquid solution or (ii) thermal treatment is carried out. Therefore, no additional impurity is immixed in the film forming material.

Therefore, according to the methods, a high purity film forming material can be collected and recycled without any additional complicated separation process.

The fragment which has been attracted by the magnet can be separated and collected by the step (b). Such collection of the fragment will contribute to cost reduction and/or prevention of environmental destruction.

Advantageous Effects of Invention

Each of the methods of the present invention employs (i) the film forming jig having the at least part on which the layer, made from the material that is attracted by a magnet, is formed, the at least part making in contact with the film forming material or (ii) the chip-off tool having the at least part which is made from the material that is attracted by a magnet, the at least part making in contact with the film forming material. The fragment made from the material that is attracted by a magnet, which fragment has been exfoliated together with the film forming material in the step (a), is attracted by the magnet to be separated from the film forming material. It is therefore possible to efficiently collect the film forming material at low cost.

BRIEF DESCRIPTION OF DRAWINGS (a) through (d) of FIG. 1 are a view illustrating an order of steps, of Embodiment 1 of the present invention, in which a film forming material is exfoliated and collected.

FIG. 2 is a cross-sectional view schematically illustrating a configuration of a vacuum vapor deposition device employed in Embodiment 1 of the present invention.

(a) and (b) of FIG. 3 each are a cross-sectional view illustrating a layer structure of a chamber component included in the vacuum vapor deposition device.

Figure 10:
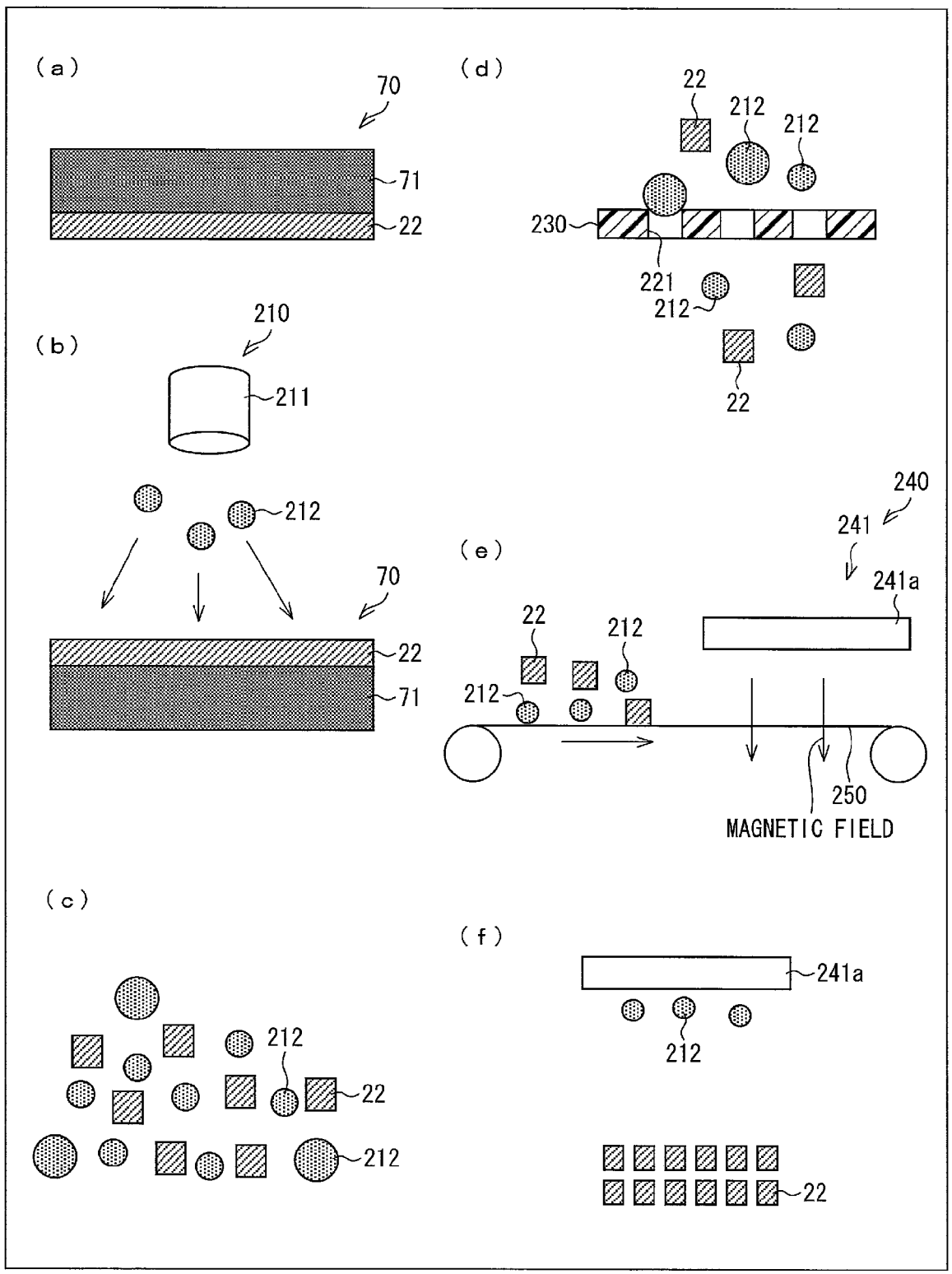

(a) through (f) of FIG. 10 are views illustrating steps of exfoliating and collecting a film forming material in accordance with Embodiment 2 of the present invention.

Figure 11:
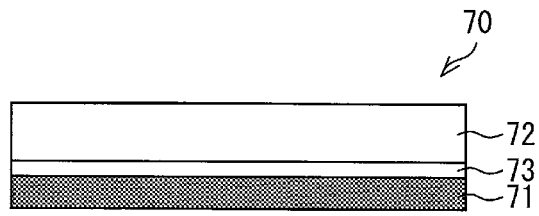

FIG. 11 is a cross-sectional view illustrating a layer structure of a chamber component included in a vacuum vapor deposition device employed in Embodiment 3 of the present invention.

Figure 12:
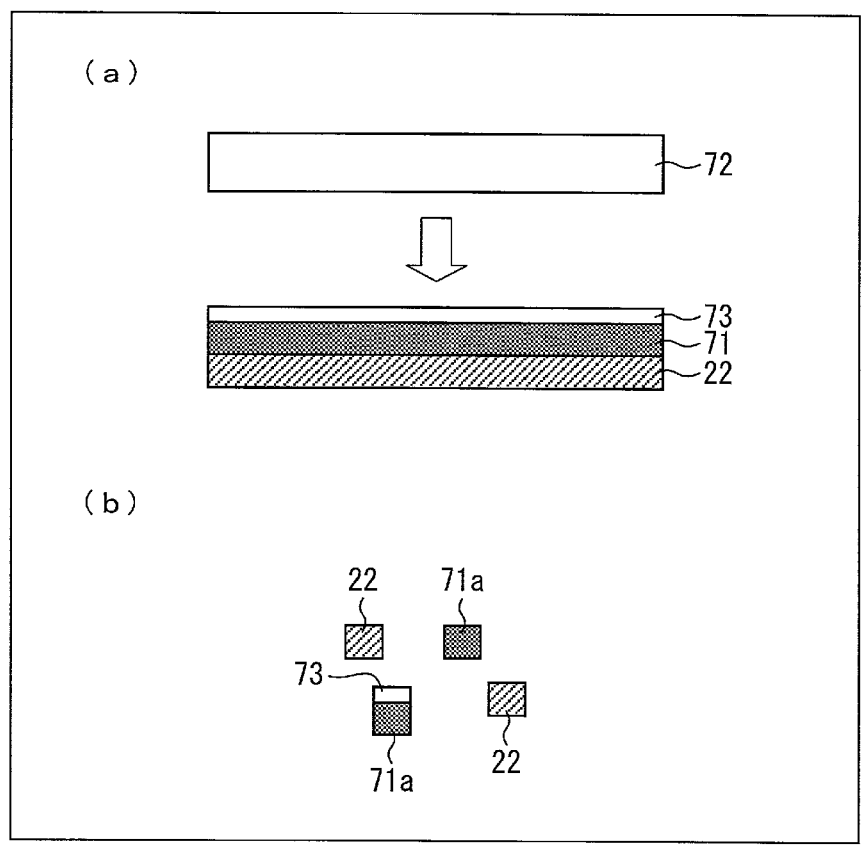

(a) and (b) of FIG. 12 are a view partially illustrating steps of exfoliating and collecting a film forming material in accordance with Embodiment 3 of the present invention.

DESCRIPTION OF EMBODIMENTS

Embodiment 1

The following description will discuss, with reference to (a) through (d) of FIG. 1, and FIG. 2 through FIG. 8, (i) a method of Embodiment 1 for collecting a film forming material and (ii) a film forming device and a collecting device each for use in collection of a film forming material.

Embodiment 1 will describe a collection of a film forming material for use in a vacuum deposition method. Specifically, Embodiment 1 will exemplify a case where a vapor deposition material, which is to be used to form a film formation pattern by use of a vacuum vapor deposition method, is collected during production of an organic EL display device.

First, a configuration of the organic EL display device will be described below.

(Overall Configuration of Organic EL Display Device)

Figure 5:
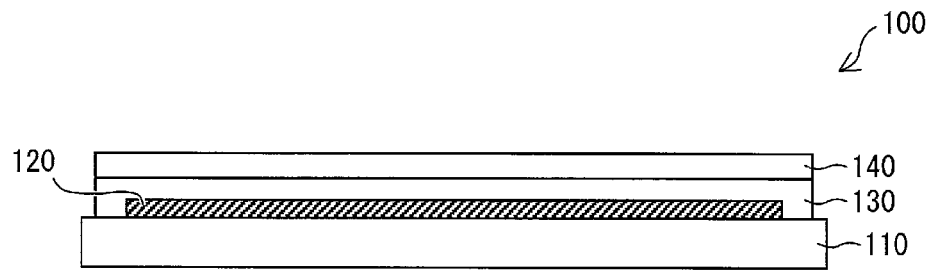
FIG. 5 is a cross-sectional view schematically illustrating a configuration of an organic EL display device.

FIG. 5 is a cross-sectional view schematically illustrating the configuration of the organic EL display device.

As illustrated in FIG. 5, an organic EL display device 100 includes a TFT (thin film transistor) substrate 110, organic EL elements 120, an adhesive layer 130, and a sealing substrate 140.

TFTs which serve as switching elements and other components are formed in respective pixel regions on the TFT substrate 110.

The organic EL elements 120 are formed in a matrix manner in a display region of the TFT substrate 110.

The TFT substrate 110, on which the organic EL elements 120 are formed, is combined with the sealing substrate 140, via an adhesive such as the adhesive layer 130.

Next, a configuration of the TFT substrate 110 and a configuration of the organic EL elements 120, in the organic EL display device 100, will be described in detail.

(Configuration of TFT Substrate 110)

Figure 6:
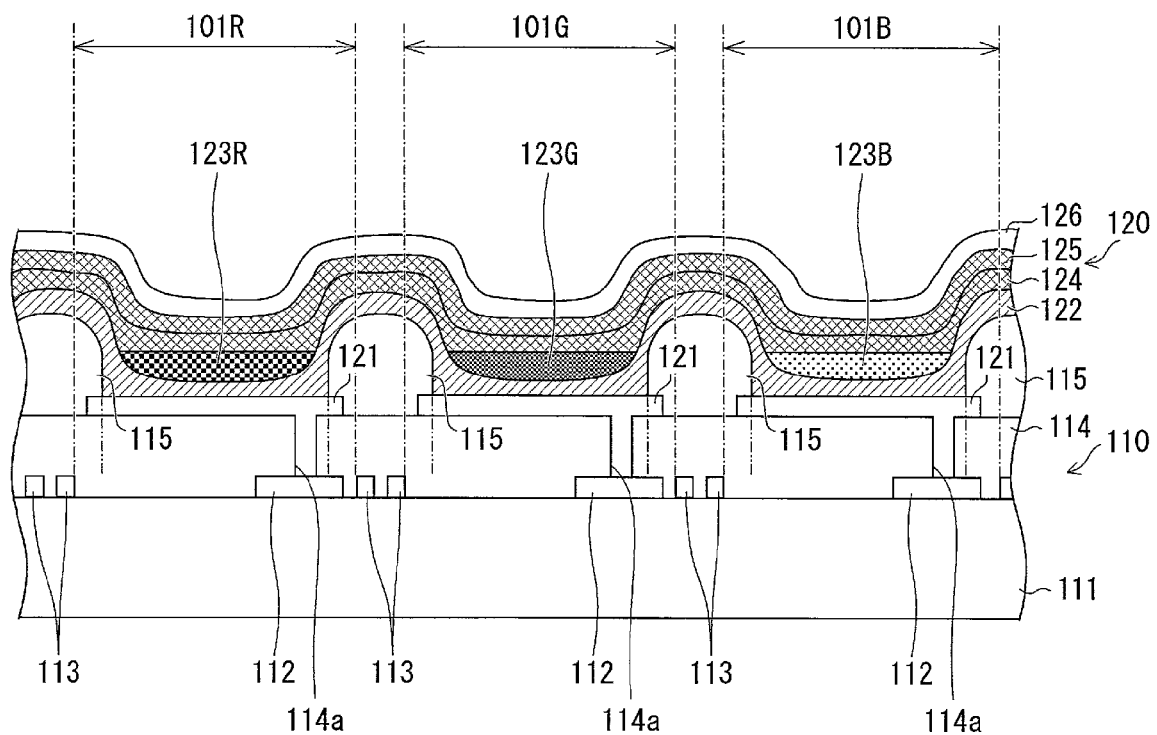
FIG. 6 is a cross-sectional view schematically illustrating a configuration of organic EL elements which are components of a display section of the organic EL display device.

FIG. 6 is a cross-sectional view schematically illustrating the configuration of the organic EL elements 120 which constitute a display section of the organic EL display device 100.

As illustrated in FIG. 6, the TFT substrate 110 is configured so that TFTs 112 (switching elements), electric wires 113, an interlayer insulating film 114, edge covers 115, and other components are provided on a transparent insulating substrate 111 such as a glass substrate.

The organic EL display device 100 is a full-color active matrix organic EL display device. (i) Pixels 101R made up of respective red (R) organic EL elements 120, (ii) pixels 101G made up of respective green (G) organic EL elements 120, and (iii) pixels 101B made up of respective blue (B) organic EL elements 120 are arranged in a matrix manner in regions surrounded by the respective electric wires 113 on the insulating substrate 111.

The TFTs 112 are provided for the respective pixels 101R, 101G, and 101B. Note that a configuration of the TFTs has been conventionally well known. Therefore, layers of a TFT 112 are neither illustrated nor described.

The interlayer insulating film 114 is formed all over the insulating substrate 111 so as to cover the TFTs 112 and the electric wires 113.

First electrodes 121 are formed for the respective organic EL elements 120 on the interlayer insulating film 114.

The interlayer insulating film 114 has contact holes 114*a*, via which the first electrodes 121 for the respective organic EL elements 120 are electrically connected to the respective TFTs 112. This causes the TFTs 112 to be electrically connected to the respective organic EL elements 120, via the respective contact holes 114*a*.

The edge covers 115 function as an electrically insulating layer for preventing a short circuit from being caused between the respective first electrodes 121 and a second electrode 126 of the organic EL elements 120. Such a short circuit will be caused by (i) a reduction in thickness of an organic EL layer at an edge part of a first electrode 121 or (ii) a concentration of an electric field at the edge part.

The edge covers 115 are provided on the interlayer insulating film 114 so as to cover the edge parts of the first electrodes 121.

The first electrodes 121 have respective parts which are exposed in areas where no edge cover 115 is formed (see FIG. 6). The parts serve as light emitting sections of the respective pixels 101R, 101G, and 101B.

In other words, the pixels 101R, 101G, and 101B are separated from one another by the edge covers 115 each having an electrically insulating property. The edge covers 115 therefore function as an element separating film.

(Method for Producing TFT Substrate 110)

Examples of the insulating substrate 111 encompass a non-alkali glass substrate and a plastic substrate. In Embodiment 1, a non-alkali glass substrate having a thickness of 0.7 mm was employed as the insulating substrate 111.

Each of the interlayer insulating film 114 and the edge covers 115 can be made from a publicly known photosensitive resin. Examples of the photosensitive resin include an acrylic resin and a polyimide resin.

The TFTs 112 are prepared by a publicly known method. As already described, Embodiment 1 exemplifies the active matrix organic EL display device 100 in which the TFTs 112 are formed for the respective pixels 101R, 101G, and 101B.

Embodiment 1 is, however, not limited to the active matrix organic EL display device 100. The present invention is also applicable to production of a passive matrix organic EL display device in which no TFT is formed.

(Configuration of Organic EL Element 120)

Each of the organic EL elements 120 is a light emitting element which can emit high luminant light by being driven by a low-voltage direct current. The organic EL elements 120 are configured so that the respective first electrodes 121, the organic EL layer, and the second electrode 126 are stacked in this order.

The first electrodes 121 function to inject (supplying) holes into the organic EL layer. As already described, the first electrodes 121 are connected to the TFTs 112 via the respective contact holes 114*a*.

The organic EL layer is provided between the first electrodes 121 and the second electrode 126. Specifically, in the organic EL layer, for example, (i) a hole injecting and transporting layer 122, (ii) luminescent layers 123R, 123G, and 123B, (iii) an electron transporting layer 124, and (iv) an electron injecting layer 125 are stacked in this order from a first electrodes 121 side (see FIG. 6).

Note that a carrier blocking layer (not illustrated) for blocking a flow of carriers, such as holes and/or electrons, can be further provided between the first electrodes 121 and the second electrode 126 as needed. Note also that a single layer can have multiple functions. For example, a single layer can function as a hole injecting layer and a hole transporting layer.

The above order of stacking in the organic EL layer corresponds to a case where (a) the first electrodes 121 serve as anodes and (b) the second electrode 126 serves as a cathode. In contrast, in a case where (i) the first electrodes 121 serve as cathodes and (ii) the second electrode 126 serves as an anode, an order of stacking in the organic EL layer is reversed.

The hole injecting layer functions to increase efficiencies of hole injection into the respective luminescent layers 123R, 213G, and 123B. The hole transporting layer functions to increase efficiencies of hole transportation to the respective luminescent layers 123R, 213G, and 123B. The hole injecting and transporting layer 122 is uniformly formed all over the display region of the TFT substrate 110 so as to cover the first electrodes 121 and the edge covers 115.

As already described, according to Embodiment 1, the hole injecting and transporting layer 122, in which the hole injecting layer is integrated with the hole transporting layer, is formed so as to function as the hole injecting layer and the hole transporting layer. However, Embodiment 1 is not limited to such. Alternatively, the hole injecting layer and the hole transporting layer can be independently formed.

On the hole injecting and transporting layer 122, the luminescent layers 123R, 123G, and 123B are formed for the respective pixels 101R, 101G, and 101B.

Each of the luminescent layers 123R, 123G, and 123B functions to emit light in response to recombination of (i) holes injected from the first electrode 121 side and (ii) electrons injected from a second electrode 126 side. Each of the luminescent layers 123R, 123G, and 123B is made from a material, such as a low-molecular fluorescent dye or a metal complex, which has a high luminous efficiency.

The electron transporting layer 124 functions to increase efficiencies of electron transportation to the respective luminescent layers 123R, 123G, and 123B from the second electrode 126. The electron injecting layer 125 functions to increase efficiencies of electron injection into the respective luminescent layers 123R, 123G, and 123B from the second electrode 126.

The electron transporting layer 124 is uniformly formed (i) on the luminescent layers 123R, 123G, and 123B and the hole injecting and transporting layer 122 and (ii) all over the display region of the TFT substrate 110 so as to cover the luminescent layers 123R, 123G, and 123B and the hole injecting and transporting layer 122.

The electron injecting layer 125 is uniformly formed (i) on the electron transporting layer 124 and (ii) all over the display region of the TFT substrate 110 so as to cover the electron transporting layer 124.

According to Embodiment 1, the electron transporting layer 124 and the electron injecting layer 125 are independently formed. However, Embodiment 1 is not limited to this. The electron transporting layer 124 and the electron injecting layer 125 can be integrated with each other. That is, the organic EL display device 100 can include an electron transporting and injecting layer instead of including the electron transporting layer 124 and the electron injecting layer 125.

The second electrode 126 functions to inject electrons into the organic EL layer which is made up of organic layers. The second electrode 126 is uniformly formed on the electron injecting layer 125 and all over the display region of the TFT substrate 110 so as to cover the electron injecting layer 125.

Note that organic layers other than the luminescent layers 123R, 123G, and 123B are not essential to the organic EL layer, and therefore can be formed in accordance with a property of a required organic EL elements 120 as needed.

A single layer can have multiple functions, like the hole injecting and transporting layer 122 or the electron transporting and injecting layer.

The organic EL layer can further include a carrier blocking layer as needed. For example, in a case where a hole blocking layer, which serves as the carrier blocking layer, is formed between the electron transporting layer 124 and the respective luminescent layers 123R, 123G, and 123B, the hole blocking layer prevents holes from entering the electron transporting layer 124. This allows an improvement in luminous efficiency.

(Method for Producing Organic EL Element 120)

The first electrodes 121 are formed by (i) sputtering an electrode material so as to form electrodes by use of a method such as a sputtering method and then (ii) patterning the electrodes, by means of photolithography and etching, so that the electrodes correspond to the respective pixels 101R, 101G, and 101B.

Examples of a material for the first electrodes 121 encompass various electrically conductive materials. Note, however, that such a material should be transparent or semitransparent, in a case of a bottom emission type organic EL element which emits light toward the insulating substrate 111.

In contrast, the second electrode 126 should be transparent or semitransparent, in a case of a top emission type organic EL element which emits light from a side opposite to the substrate.

Examples of an electrically conductive film material for the first electrodes 121 and the second electrode 126 include (i) transparent conductive materials such as an indium tin oxide (ITO), an indium zinc oxide (IZO), and a gallium-added zinc oxide (GZO) and (ii) metal materials such as gold (Au), nickel (Ni), and platinum (PT).

The first electrodes 121 and the second electrode 126 can be formed by a method such as a sputtering method, a vacuum vapor deposition method, a CVD (chemical vapor deposition) method, a plasma CVD method, or a printing method. The first electrodes 121 can be stacked by use of, for example, a vapor deposition device 1 (later described).

The organic EL layer can be made from a publicly known material. The luminescent layers 123R, 123G, and 123B can be made from respective single materials or respective mixture materials in each of which a host material is mixed with a guest material or a dopant.

Examples of a material for the hole injecting layer, the hole transporting layer, and the hole injecting and transporting layer 122 include anthracene, azatriphenylene, fluorenone, hydrazone, stilbene, triphenylene, benzine, styrylamine, triphenylamine, porphyrin, triazole, imidazole, oxadiazole, oxazole, polyarylalkane, phenylenediamine, arylamine, derivatives thereof, and a heterocyclic conjugated monomer, oligomer or polymer of a compound such as a thiophene compound, a polysilane compound, a vinylcarbazole compound or an aniline compound.

The luminescent layers 123R, 123G, and 123B are made from a material, such as a low-molecular fluorescent dye or a metal complex, which has a high luminous efficiency. Examples of the material include anthracene, naphthalene, indene, phenanthrene, pyrene, naphthacene, triphenylene, perylene, picene, fluoranthene, acephenanthrylene, pentaphene, pentacene, coronene, butadiene, coumarin, acridine, stilbene, derivatives thereof, a tris(8-hydroxyquinolinato)aluminum complex, a bis(benzohydroxyquinolinato)beryllium complex, a tri(dibenzoylmethyl)phenanthroline europium complex, ditolulyvinylbiphenyl, hydroxyphenyloxazole, and hydroxyphenyltiazole.

Examples of a material for each of the electron transporting layer 124, the electron injecting layer 125, and the electron transporting and injecting layer include a tris(8-hydroxyquinolinato)aluminum complex, an oxadiazole derivative, a triazole derivative, a phenylquinoxaline derivative, and a silole derivative.

The following description will discuss a vacuum vapor deposition device employed in Embodiment 1.

(Configuration of Vapor Deposition Device)

Figure 2:
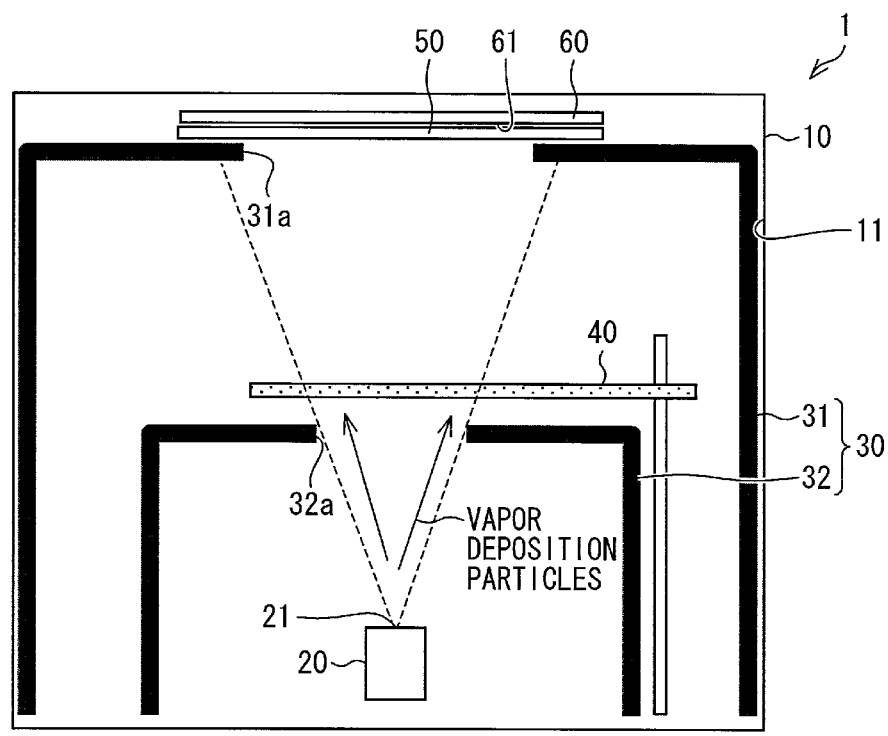

FIG. 2 is a cross-sectional view schematically illustrating a configuration of the vacuum vapor deposition device employed in Embodiment 1.

As illustrated in FIG. 2, the vapor deposition device 1 (a vacuum vapor deposition device, a vacuum film forming device) employed in Embodiment 1 includes a vacuum chamber 10 which serves as a film forming chamber.

The vacuum chamber 10 includes various components (members) such as a vapor deposition source 20, a vapor deposition-proof plate 30, and a shutter 40.

For example, a vacuum pump (not illustrated) for vacuating the vacuum chamber 10 is connected to the vacuum chamber 10, via an air-exhaust opening (not illustrated). This allows the vacuum chamber 10 to be kept vacuum during vapor deposition.

Thus, the vacuum chamber 10 can be depressurized by use of, for example, the vacuum pump (not illustrated). The vacuum chamber 10 has an open-and-close part via which the components, which are provided so as to be attached to or detached from the vacuum chamber 10, can be, for example, attached to, detached from, and taken in and out of the vacuum chamber 10.

The vapor deposition source 20 heats and sublimes, under high vacuum, a vapor deposition material, such as an organic luminescent material, which is a film forming material so as to output, as vapor deposition particles, the vapor deposition material.

Alternatively, another vapor deposition source 20 can be employed which heats a vapor deposition material which is put directly in a container provided in the vacuum chamber 10. Alternatively, a further another vapor deposition source 20 can be employed which includes a load lock type tube via which a vapor deposition material sublimed is outputted.

For example, a container, called "crucible" or "boat" in which a vapor deposition material is to be put, can be employed as the vapor deposition source 20.

In the vacuum vapor deposition method, a mask 50 for vapor deposition (called shadow mask) is employed. The mask 50 has openings 51 (through holes, see FIG. 7) in a desired shape and in respective desired locations.

The vapor deposition source 20 is provided so as to face and keep a certain distance from the mask 50 in the vacuum chamber 10. The vapor deposition source 20 is provided so as to face, via the mask 50 in the vacuum chamber 10 a film formation surface 61 of a film formation substrate 60 on which a film is to be formed.

The vapor deposition source 20 has a nozzle 21 on its surface which faces the mask 50, from which nozzle 21 the vapor deposition material is outputted (scattered) as vapor deposition particles. The vapor deposition source 20 illustrated in FIG. 2 also has a mechanism for scattering the vapor deposition particles, for example, upwards.

According to an example configuration illustrated in FIG. 2, the vapor deposition source 20 is provided below the film formation substrate 60 so that the film formation substrate 60 closely contacts with and is held by the mask 50 while the film formation surface 61 is facing downwards.

Further, the vapor deposition-proof plate 30 is provided in an vapor deposition particle scattering region (such as (i) an inner wall 11 of the vacuum chamber 10 and (ii) a circumference of the vapor deposition source 20) of the vacuum chamber 10, except for a scattering path of vapor deposition particles between (a) the nozzle 21 of the vapor deposition source 20 and (b) an opening region (a region where group of opening parts are formed) of the mask 50 (see FIG. 2). The vapor deposition particle scattering region is a region where no vapor deposition particle is desired to be scattered. In other words, the vapor deposition particle scattering region corresponds to an extra scattering region which does not include the scattering path where vapor deposition particles are needed.

According to Embodiment 1, a first vapor deposition-proof plate 31 and a second vapor deposition-proof plate 32 are provided as the vapor deposition-proof plate 30.

Specifically, according to Embodiment 1, the first vapor deposition-proof plate 31 having an opening 31a which serves as a vapor exhaust port is provided so as to be adjacent to and cover the inner wall 11 of the vacuum chamber 10, except for the scattering path of vapor deposition particles between (a) the nozzle 21 of the vapor deposition source 20, which nozzle 21 serves as a vapor exhaust port, and (b) the opening region (the region where group of opening parts are formed) of the mask 50.

The second vapor deposition-proof plate 32 having an opening 32a which serves as a vapor exhaust port is provided so as to surround the vapor deposition source 20, except for the scattering path.

If no vapor deposition-proof plate 30 is provided, all vapor deposition particles (scattered materials), other than vapor deposition particles that have reached the mask 50 and the film formation substrate 60, attach to the components (such as the inner wall 11 and the shutter 40 of the vacuum chamber 10) of the vapor deposition device 1, during production of the organic EL display device 100.

The vapor deposition-proof plate 30 is provided in the vacuum chamber 10, in order to prevent vapor deposition particles from attaching to (i) the inner wall 11, (ii) parts such as a driving section, and (iii) extra parts excluding the opening region of the mask 50. This ultimately allows the parts (i) through (iii) not to be contaminated.

The shutter 40 is further provided between the vapor deposition source 20 and the mask 50 so as to determine whether or not vapor deposition particles should be outputted toward the film formation substrate 60. This makes it possible to control the vapor deposition particles, scattered from the vapor deposition source 20, to reach or not to reach the mask 50.

The shutter 40 prevents vapor deposition particles from being scattered in the vacuum chamber 10, in a case where (i) a vapor deposition rate is stabilized or (ii) no vapor deposition is necessary. For example, the shutter 40 cuts off the scattering path of vapor deposition particles so as to prevent the vapor deposition particles from reaching the film formation substrate 60 during alignment of the film formation substrate 60 and the mask 50.

For example, the shutter 40 is provided so as to be moved (so as to be inserted) in between or so as to be away from the mask 50 and the vapor deposition source 20.

For example, the shutter 40 covers the openings 51 of the mask 50 by being inserted in between the mask 50 and the vapor deposition source 20 upon receipt of a vapor deposition OFF signal from a control section (not illustrated). In contrast, the shutter 40 does not cover the openings 51 of the mask 50 by being away from the mask 50 and the vapor deposition source 20 upon receipt of a vapor deposition ON signal from the control section.

Since the shutter 40 is thus interposed between the mask 50 and the vapor deposition source 20 as needed, it is possible to prevent vapor deposition from being carried out with respect to an extra part (a non-vapor deposition region) of the film formation substrate 60.

The components (members), such as the vapor deposition-proof plate 30 and the shutter 40 which are provided in the vacuum chamber 10 and to which a vapor deposition material such as an organic EL material that is a film forming material to be collected attaches, are configured so as to be attached to or detached from the vapor deposition device 1. This allows the vapor deposition material, which has attached to the components, to be easily collected.

The vapor deposition-proof plate 30 can be formed by, for example, bending a thin plate-like base material. It is, however, more preferable that the vapor deposition-proof plate 30 is separated into parts so as to be easily attached to or detached from the vapor deposition device 1.

According to Embodiment 1, at least part, on at least surfaces of components such as the vapor deposition-proof plate 30 and the shutter 40 (hereinafter referred to as "chamber components") (i) which are each employed as a film forming jig, (ii) which are provided in the vacuum chamber 10, and (iii) to which a vapor deposition material attaches, which at least part makes in contact with a vapor deposition material, is made from a material that is attracted by a magnet. This is for the purpose of efficiently collecting and reusing the vapor deposition material which has attached to the chamber components.

In other words, a layer, made from a material which is attracted by a magnet, is formed on at least the surface of each of the chamber components.

Each of the chamber components can be made merely from a material that is attracted by a magnet. Alternatively, merely the surface of each of the chamber components can be made from a material that is attracted by a magnet.

Figure 3:
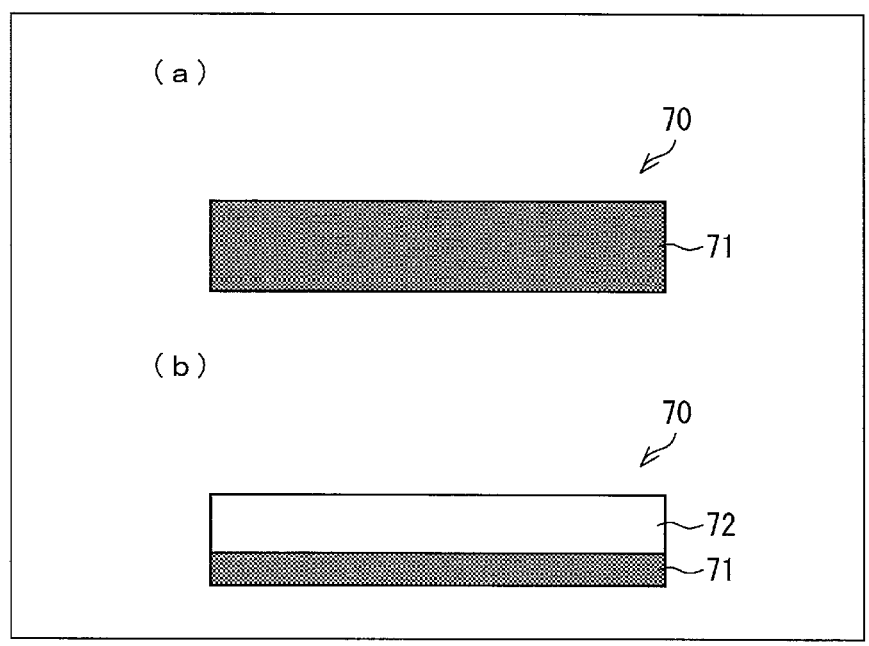

(a) and (b) of FIG. 3 each are a cross-sectional view illustrating a layer structure of one of the chamber components.

A chamber component 70 in the vapor deposition device 1 can be a layer 71 made from a material that is attracted by a magnet (see (a) of FIG. 3). Alternatively, the chamber component 70 can be configured so that a layer 71, made from a material that is attracted by a magnet, is formed on a surface of a base material 72 (see (b) of FIG. 3).

The chamber component 70 is not limited to a specific member, provided that it is (i) provided, in the vacuum chamber 10, in a location where a scattered vapor deposition material attaches and (ii) a film forming jig which is a consumable good and replaceable with a new one. Examples of the chamber component 70 encompass the vapor deposition-proof plate 30 and the shutter 40.

The material, which is attracted by a magnet, employed in Embodiment 1 is not limited to a specific material, provided that it is a material that is attracted by a magnet. Typical examples of the material include a ferromagnetic material (ferromagnet) and a ferrimagnetic material which are magnetic materials having a ferromagnetic part.

The ferromagnetic material is a magnetic material whose all magnetic moments are in parallel to each other. Typical examples of the ferromagnetic material include iron, cobalt, nickel, and stainless steel (SUS). Note that an alloy changes its magnetism depending on its blending ratio.

The ferrimagnetic material is a magnetic material containing a ferromagnetic part and an antiferromagnetic part. In the ferrimagnetic material, magnetic moments are aligned in opposite directions and have different magnitudes. This causes magnetization to be generated in accordance with a difference of the magnetic moments. A typical example of the ferrimagnetic material is a ferrite.

Like Embodiment 1, in a case where the chamber component 70 is made from a ferromagnetic material, a metal such as iron, cobalt, or nickel is, among others, suitably employed as the ferromagnetic material.

The chamber components 70 such as the vapor deposition-proof plate 30 are preferably made from a material which is as hard as possible so as to maintain their respective shapes.

A material that is attracted by a magnet and the layer 71 made from such a material are preferably as hard as possible so as to be used as many times as possible. This is because the usage count of the layer 71 is decreased in a case where the layer 71 is exfoliated and denaturalized in large quantity by an attachment exfoliating process in which a vapor deposition material which has attached to the chamber component 70 is exfoliated from the chamber component 70.

A material that is attracted by a magnet and the layer 71 made from such a material are preferably as hard as possible, from the viewpoint of decrease in mixed amount of parts detached (exfoliated) from the layer 71 to be mixed so that a purity of a collected material which has been subjected to a magnetic field passing process is increased. A material for the chamber component 70 can be appropriately selected and adjusted in accordance with, for example, processability and material costs of the chamber components 70.

It is preferable that the layer 71 made from a material that is attracted by a magnet is a single layer so as to be collected and recycled.

In contrast, the base material 72 is not limited to a specific one, and therefore can be a single layer or two or more layers. Furthermore, the base material 72 can be made from a single material or two or more materials.

The material for the base material 72 is not limited to a specific material. In accordance with a kind of the chamber component 70, various materials can be employed as the base material 72. Examples of such various materials encompass (i) metals, (ii) heat resistance resins such as a polyimide resin and a silicon resin, (iii) glass, and (iv) ceramics which are generally employed as materials for the chamber components 70. The material for the base material 72 can be selected as appropriate in accordance with, for example, processability and material costs of the chamber components 70.

It is further preferable that the layer 71, made from a material that is attracted by a magnet, has, for example, a satin finish surface so as to prevent a vapor deposition material, which has attached to the satin finish surface, from being exfoliated from the satin finish surface.

(Method for Forming Film Formation Pattern by Vacuum Vapor Deposition Method)

Figure 7:
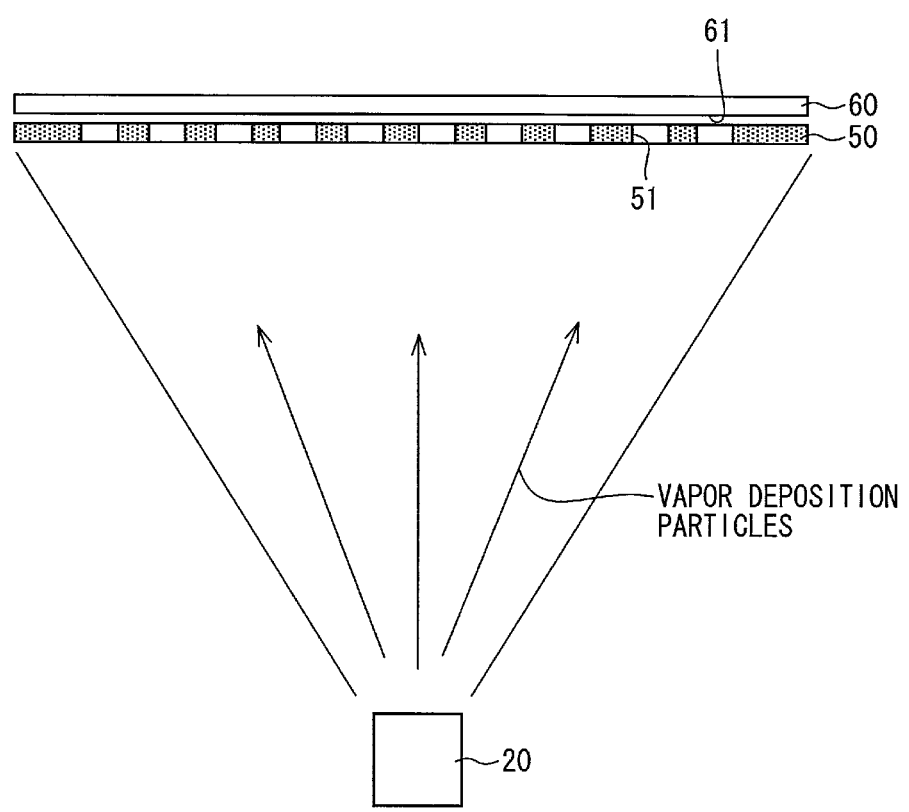
FIG. 7 is a cross-sectional view schematically illustrating a method for forming, by means of vacuum vapor deposition, a film formation pattern on a substrate on which a film is to be formed.
Figure 8:
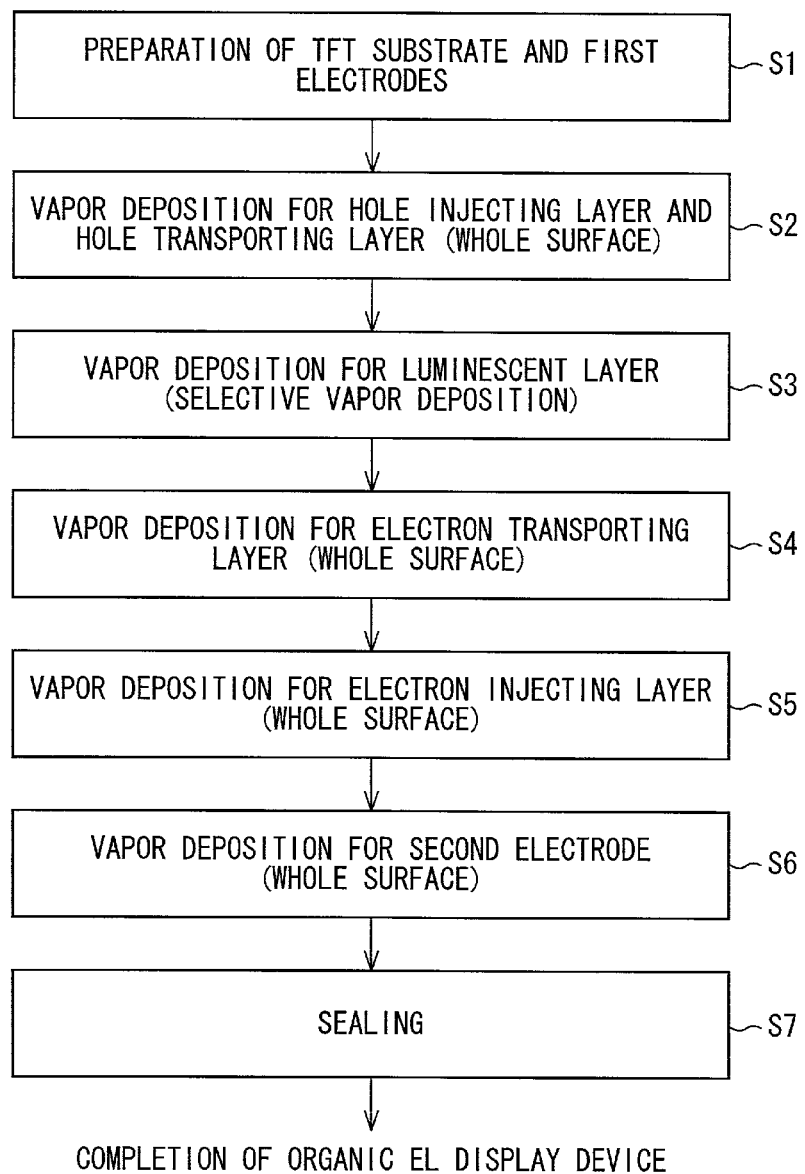
FIG. 8 is a flowchart illustrating an order in which the organic EL display device is produced.

The following description will discuss a method for forming a film formation pattern by means of vacuum vapor deposition, mainly with reference to FIGS. 7 and 8.

FIG. 7 is a cross-sectional view schematically illustrating a method for forming, by means of vacuum vapor deposition, a film formation pattern on a substrate on which a film is to be formed.

Note that what is described below as an example is a case where (i) the TFT substrate 110 is employed as the film formation substrate 60, (ii) an organic light emitting material is employed as a vapor deposition material, and (iii), on the film formation substrate 60 on which the first electrodes 121 have been formed, an organic EL layer is formed, as a vapor deposition film, by use of a vacuum vapor deposition method.

Note also that FIG. 7 does not illustrate chamber components 70 such as the vapor deposition-proof plate 30 and the shutter 40, except for the mask 50.

As already described, the full-color organic EL display device 100 is configured so that, for example, (i) the pixels 101R made up of respective organic EL elements 120 each of which includes a red (R) luminescent layer 123R, (ii) the pixels 101G made up of respective organic EL elements 120 each of which includes a green (G) luminescent layer 123G, and (iii) the pixels 101B made up of respective organic EL elements 120 each of which includes a blue (B) luminescent layer 123B are arranged in a matrix manner.

Note that, for example, (i) a cyan (C) luminescent layer, a magenta (M) luminescent layer, and a yellow (Y) luminescent layer or (ii) a red (R) luminescent layer, a green (G) luminescent layer, a blue (B) luminescent layer, and a yellow (Y) luminescent layer can be employed, instead of the red (R) luminescent layer 123R, the green (G) luminescent layer 123G, and the blue (B) luminescent layer 123B.

According to the full-color organic EL display device 100, a full color image is displayed by controlling, with the use of the TFTs 112, each of the organic EL elements 120 to selectively emit light having a desired luminance.

In order to produce the full-color organic EL display device 100, it is necessary to form luminescent layers for the respective organic EL elements 120 in a predetermined pattern on the film formation substrate 60. Note that the luminescent layers are made from respective organic luminescent materials which emit respective red, green, and blue light.

As already described, the mask 50 for vapor deposition has the openings 51 in the desired shape and in the respective desired locations of the mask 50.

As illustrated in FIGS. 2 and 7, the mask 50 is (i) fixed onto the film formation surface 61 of the film formation substrate 60 or (ii) provided so as to face the film formation surface 61 via a certain space.

According to Embodiment 1, the mask 50 is identical in size to the film formation substrate 60, and is fixed so as to be closely contacted with the film formation surface 61. Note, however, that Embodiment 1 is not limited to this.

For example, the film formation substrate 60 can be moved in a path of vapor deposition particles which are to be outputted from the vapor deposition source 20 while the vapor deposition source 20 and a mask 50 which is smaller in size than the film formation substrate 60 are being fixed.

Note that the present invention does not limit a vapor deposition method itself to a specific one, provided that at least a surface of each chamber component 70 is made from a material that is attracted by a magnet. The present invention is therefore applicable even to a case where a different vapor deposition method is employed as described above.

Note also that the vapor deposition source 20 is provided so as to face, via the mask 50, the film formation surface 61 of the film formation substrate 60 (see FIGS. 2 and 7).

Each of the organic luminescent materials is heated and sublimed under high vacuum so as to be outputted as vapor deposition particles from the vapor deposition source 20.

Then, the vapor deposition particles are vapor-deposited on the film formation substrate 60 via the openings 51 of the mask 50.

This causes an organic film having a desired film formation pattern to be merely formed, as a vapor deposition film, on respective desired locations of the film formation substrate 60 which correspond to the openings 51. Note that each vapor deposition is made for a corresponding one of different colors of the luminescent layers (called "selective vapor deposition).

For example, in a case of the configuration illustrated in FIG. 6, the hole injecting and transporting layer 122 is formed all over the display section. Specifically, the hole injecting and transporting layer 122 is formed, while employing, as the mask 50 for vapor deposition, an open mask having merely openings for (i) the whole surface of the display section and (ii) regions where the hole injecting and transporting layer 122 should be formed.

Similarly, the electron transporting layer 124, the electron injecting layer 125, and the second electrode 126 are formed.

In a case where the red (R) luminescent layer 123R of a pixel for displaying a red color is formed (see FIG. 6), a fine mask, which merely has an opening corresponding to a region where a red luminescent material is vapor-deposited, is employed as the mask 50 for vapor deposition.

(Flow of Process of Producing Organic EL Display Device 100)

FIG. 8 is a flowchart illustrating an order in which the organic EL display device 100 is produced.

First, a TFT substrate 110 is prepared, and first electrodes 121 are formed on the TFT substrate 110 (step S1). Note that the TFT substrate 110 can be prepared by means of a publicly known technique.

Subsequently, with the use of the vacuum vapor deposition method, a hole injecting layer and a hole transporting layer are formed all over each pixel region on the TFT substrate 110, where the first electrodes 121 have been formed, while employing an open mask as the mask 50 for vapor deposition (step S2). Note that, as already described, a hole injecting and transporting layer 122 can be employed instead of the hole injecting layer and the hole transporting layer.

Then, with the use of the vacuum vapor deposition method, luminescent layers 123R, 123G, and 123B are selectively vapor-deposited for respective colors, while employing a fine mask as the mask 50 for vapor deposition (step S3). This causes pattern films to be formed for respective pixels 101R, 101G, and 101B.

With the use of the vacuum vapor deposition method, an electron transporting layer 124, an electron injecting layer 125, and a second electrode 126 are then formed, in this order, all over the respective pixel regions on the TFT substrate 110 where the luminescent layers 123R, 123G, and 123B have been formed, while employing an open mask as the mask 50 for vapor deposition (steps S4 through S6).

Finally, in the TFT substrate 110 which has been subjected to vapor deposition, a region of organic EL elements 120 (a display section) is sealed so as not to be deteriorated by moisture and oxygen in the air (step S7).

Examples of a method for such sealing encompass (i) a method in which a film, that does not easily transmit moisture and oxygen, is formed by means of CVD and (ii) a method in which, for example, a glass substrate is combined with the TFT substrate 110 by use of an adhesive or the like.

The organic EL display device 100 is thus prepared through the steps S1 through S7. The organic EL display device 100 can carry out a desirable display, by causing the organic EL elements 120 for the respective pixels to emit light in response to an electric current supplied from an external driving circuit.

(Collection and Recycling of Material which has Attached to Chamber Components 70)

Figure 4:
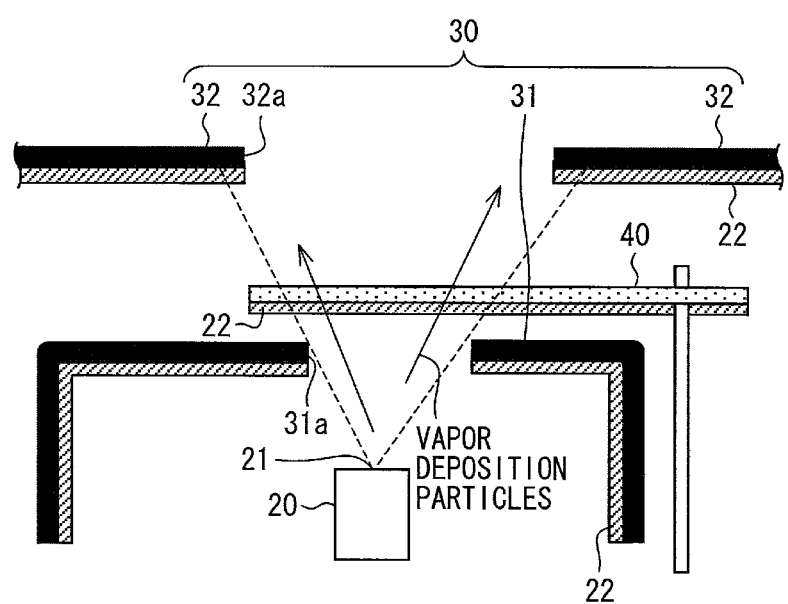
FIG. 4 is a cross-sectional view schematically illustrating a configuration of a main part of a vacuum chamber that has been subjected to a vapor deposition.

FIG. 4 is a cross-sectional view schematically illustrating a configuration of a main part of the vacuum chamber 10 that has been subjected to a vapor deposition.

According to the vacuum vapor deposition, a vapor deposition material is heated and sublimed under high vacuum, as has been early described. This causes vapor deposition particles outputted from the vapor deposition source 20 to be extensively scattered in the vacuum chamber 10.

In a case where a vapor deposition process (vacuum vapor deposition) is repeated, scattered vapor deposition particles attach to and accumulate on the chamber components 70 (such as the vapor deposition-proof plate 30 and the shutter 40) to become attachments 22 as a result of such repetitive vapor deposition processes (see FIG. 4).

An organic material for an organic film that constitutes the organic EL elements 120 is remarkably expensive, among materials employed in production of the organic EL display device 100. A decrease in utilization efficiency of the organic material therefore causes an increase in amount of organic material to be used in one (1) organic EL display device 100. This ultimately causes an increase in production cost of the organic EL display device 100.

Collection and recycling of a vapor deposition material which has not attached to the film formation substrate 60 is therefore a remarkably significant process for production of the organic EL display device 100.

As early described, the repetitive vapor deposition processes cause a vapor deposition material outputted from the vapor deposition source 20 to attach to the chamber components 70. Note, however, that in a case where not less than a certain amount of the vapor deposition material attaches to the chamber components 70, part of the attachments exfoliates from the chamber components 70 due to, for example, its weight. This causes the vacuum chamber 10 to be contaminated. Therefore, the chamber components 70, which are provided in respective regions to which vapor deposition particles attach, require their respective periodic replacements.

In view of the circumstances, according to Embodiment 1, attachments 22, which have attached to chamber components 70 in the vacuum chamber 10, the chamber components requiring their respective periodic replacements, are exfoliated and collected from the chamber components 70 so as to be recycled.

Figure 1:
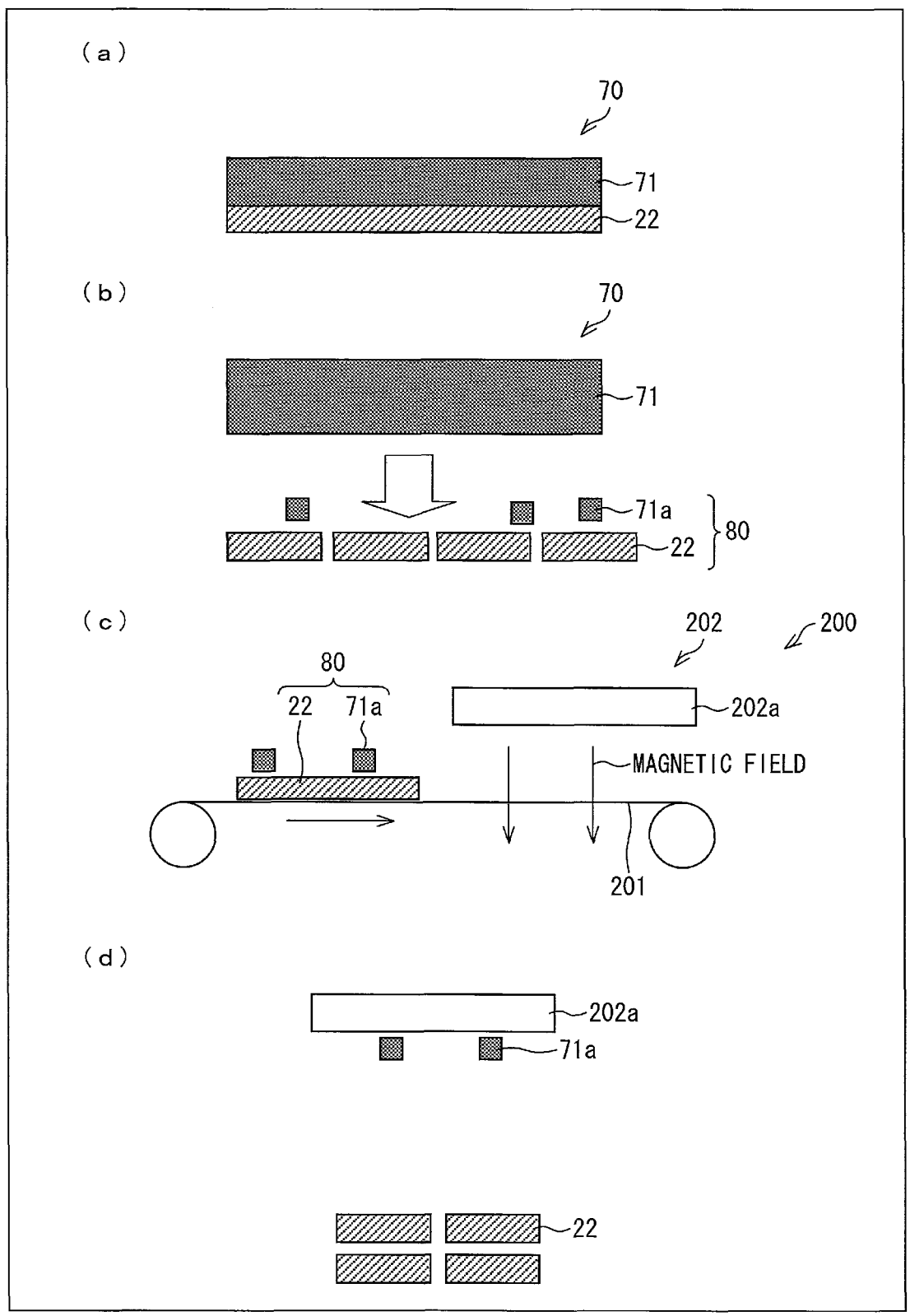

(a) through (d) of FIG. 1 are a view illustrating an order of steps of Embodiment 1 in which attachments 22 are exfoliated and collected.

Attachments 22 are collected in a case where a predetermined vapor deposition condition, such as a predetermined number of vapor depositions and/or a predetermined accumulation thickness of the attachments 22, is met, in other words, in a case where, for example, a predetermined condition for replacement of a chamber component 70 is met.

In a case of exfoliating and collecting an attachment 22, a chamber component 70, to which the attachment 22 has attached as a result of repetitive vapor depositions, is first taken out of the vacuum chamber 10 (see (a) of FIG. 1).

Next, the attachment 22 which has attached to the chamber component 70 is chipped off so as to be exfoliated from the chamber component 70 (see (b) of FIG. 1) (attachment exfoliating process, exfoliating process).

Note that not only the attachment 22 but also part of a layer 71, which is (i) formed on a surface of the chamber component 70 and (ii) made from a material that is attracted by a magnet, is exfoliated.

Therefore, collected materials 80, which are chipped off from the chamber component 70, contain a fragment 71a of the layer 71 (that is, an exfoliated part of the layer 71).

A method for exfoliating the attachment 22 from the chamber component 70 is not limited to a specific one. It is preferable that the attachment 22 is exfoliated from the chamber component 70 by means of dry exfoliation.

Examples of a chip-off tool encompass various publicly known grinding tools and cutting tools such as a scraper (for example, a spatula), a grinder, and a polisher.

(c) of FIG. 1 is a drawing schematically illustrating a configuration of a main part of an attachment collecting device employed in Embodiment 1.

An attachment collecting device 200 employed in Embodiment 1 includes an immixed material collecting section 202 for separating and collecting the fragment 71a that is an immixed material (impurity) from the collected materials 80 (see (c) of FIG. 1). The attachment collecting device 200 further includes a conveying member for conveying the collected materials 80 to the immixed material collecting section 202, for example, a conveyer 201.

According to the immixed material collecting section 202, a magnet 202a, such as an electromagnet or a magnetic plate, is provided so as to come close to the conveyer 201.

The collected materials 80 are placed on the conveyer 201 and are then conveyed toward the immixed material collecting section 202 by the conveyer 201 so as to pass through a magnetic field caused by the magnet 202a, while securing a space between the magnet 202a and the conveyer 201 (magnetic field passing process, separation process).

Since the fragment 71a is made from a material that is attracted by a magnet, the fragment 71a is attracted, by the magnet 202a, in the immixed material collecting section 202 (see (d) of FIG. 1). In contrast, since the attachment 22 is a vapor deposition material, the attachment 22 is not attracted by the magnet 202a.

Generally, an organic material employed in an organic EL element is neither a ferromagnetic material nor a ferrimagnetic material.

The attachment 22 and the fragment 71a can be thus separated from each other and separately collected, by causing the collected materials 80 to pass through the magnetic field.

Note that the number of the magnetic field passing processes is not limited to once but can be more than once. The magnetic field passing process makes it possible to further increase purity of a finally collected attachment 22 (that is, purity of a finally collected vapor deposition material).

Note that organic films are vapor-deposited, that is, vapor deposition films, made from the respective organic luminescent materials, are deposited by use of respective vacuum chambers 10.

For example, a red luminescent layer 123R is formed in a vacuum chamber 10 for forming a red luminescent layer. Similarly, a green luminescent layer 123G is formed in a vacuum chamber 10 for forming a green luminescent layer, and a blue luminescent layer 123B is formed in a vacuum chamber 10 for forming a blue luminescent layer.

It follows that attachments 22, which have attached to chamber components 70 in each of the vacuum chambers 10 (for example, chamber components 70 such as a vapor deposition-proof plate 30 and a shutter 40 in a corresponding vacuum chamber 10 illustrated in FIG. 4), are made from a single material.

As such, in a case where the attachments 22 are exfoliated from the chamber components 70, the single material can be obtained unless a property of the attachments 22 has not changed during vapor deposition.

Note, however, that in a case where at least two different organic materials are simultaneously vapor-deposited during, for example, forming of a luminescent layer, a mixture of the at least two different organic materials (an attachment 22) attaches to chamber components 70. In such a case, in order to separate organic materials separately from the attachment 22, the attachment 22 should be further purified after the magnetic field passing process. Note that no such purification is required in a case where the mixture of the at least two different organic materials can be recycled as it is.

(Effect)

As early described, in order to recycle an attachment which has attached to chamber components, such as a vapor deposition-proof plate and a shutter, it is necessary to detach the attachment from the chamber components.

The chamber component such as the vapor deposition-proof plate is made from a strong material so as to maintain its shape. But then, in a case of chipping off a vapor deposition material which has attached to the vapor deposition-proof plate, part of the vapor deposition-proof plate will be mixed in an exfoliated vapor deposition material.

Even in a case where a vapor deposition material which has attached to chamber components is exfoliated by use of a water jet, the chamber components are damaged and exfoliated by water pressure of the water jet. A fragment of the chamber components will be mixed in an exfoliated vapor deposition material.

Such impurities (the fragment) should be separated from the exfoliated vapor deposition material because the impurities deteriorate a quality of the exfoliated vapor deposition material. It was, however, difficult to carry out such a separation. Note that it was necessary to carry out a complicated process, even in a case where the separation can be made. This caused (i) an increase in processing cost and (ii) another impurity to be mixed in during the separation in a case of recycling the exfoliated vapor deposition material. It was therefore not possible to simply and easily recycle the exfoliated vapor deposition material.

Alternatively, a method can be contrived in which a vapor deposition material is collected by use of an organic solvent which dissolves the vapor deposition material.

Examples of such a method encompass a method for immersing, in an organic solvent, a component to which a vapor deposition material has attached. This allows merely the vapor deposition material to be dissolved in the organic solvent. It is therefore possible to separate the vapor deposition material from the component.

Note, however, that such a dissolution method has the following problems (1) through (4).

(1) The organic solvent causes a cost rise. Advanced liquid-waste treatment facilities and reprocessing facilities are separately required.

(2) Impurities which are originally contained in the organic solvent will be mixed in a collected vapor deposition material. It is difficult to separate such impurities from the vapor deposition material. A high purification process, in which sublimation purification is carried out with respect to the vapor deposition material, is required (the high purification process causes a cost rise).

(3) How much the vapor deposition material can be collected is restricted because it depends on solubility of the vapor deposition material.

(4) A vapor deposition-proof plate, a shutter and other members should be resistant to the organic solvent.

It should be noted that, according to Embodiment 1, (i) the layer 71, made from a material which is attracted by a magnet, is formed on at least the surface of each of the chamber components 70, and (ii) the fragment 71a of the layer 71 is attracted by the magnet 202a by causing the collected materials 80 to pass through the magnetic field caused by the magnet 202a, which collected materials 80 have been chipped off from the chamber component 70 and contain the fragment 71a of the layer 71 which has been exfoliated from the chamber component 70 together with the attachment 22 which should be collected.

According to Embodiment 1, a fragment 71a of the chamber component 70, which fragment 71a is chipped off, can be separated and removed from the collected materials 80, even in a case where such a fragment 71a is mixed in an exfoliated vapor deposition material during collection of the exfoliated vapor deposition material (that is, collection of the collected materials 80).

According to Embodiment 1, the collected materials 80 are merely needed to pass through the magnetic field, as early described. It is therefore possible to separate and collect the attachment 22, simply and easily.

According to Embodiment 1, it is unnecessary to carry out a conventional complicated process such as (i) cleaning with a liquid solution or (ii) thermal treatment. Therefore, no additional impurity is mixed in the exfoliated vapor deposition material.

According to Embodiment 1, a high purity vapor deposition material can be thus collected and recycled without any additional complicated separation process.

The fragment 71a attracted by the magnet 202a is a raw material for a chamber component 70. It follows that the magnetic field passing process (separation process) is also a process of collecting such a raw material. In a case where (i) the raw material is expensive and/or (ii) the raw material is an environmental pollutant, collection of the fragment 71a will also contribute to cost reduction and/or prevention of environmental destruction.

According to Embodiment 1, even in a case where the layer 71 which constitutes a chamber component 70 such as the vapor deposition-proof plate 30 is made from an expensive material that is attracted by a magnet, such an expensive material can be thus collected through the magnetic field passing process.

Such collected materials can be recycled. This makes it possible to (i) achieve a simple and easy recycling process, (ii) reduce the cost of recycling process, and (iii) reduce wastes so as to alleviate environmental burdens.

Furthermore, according to Embodiment 1, no heat is applied to a vapor deposition material during the collection. The vapor deposition material is therefore not deteriorated by temperatures. Furthermore, it is not necessary to use water during exfoliation of the attachments 22 from the chamber components 70. As such, there is no possibility of denaturalization of a vapor deposition material due to moisture, and there is no need to carry out a dry process.

As early described, the exfoliation of an attachment with the use of water jet is not applicable to a vapor deposition material which is easy to denaturalize due to moisture. Since the present invention does not need to use water, the present invention is applicable to exfoliation and collection of a material whose property is easy to denaturalize due to moisture.

According to the present invention, it is possible to collect a high quality vapor deposition material by simply and easily separating immixed impurities, in view of the fact that the chamber components 70 are damaged.

Note that examples of the chamber components 70, to which the present invention is applicable, encompass various chamber components 70 in a vacuum chamber 10, not limited to the vapor deposition-proof plate 30 and the shutter 40.

Embodiment 2

Figure 9:
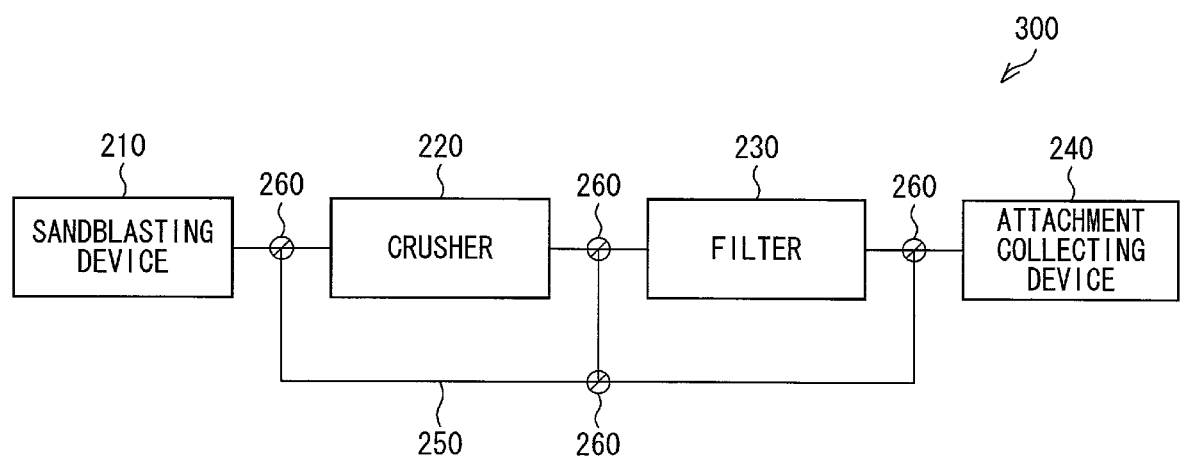
FIG. 9 is a block diagram of an example configuration of an attachment collecting system employed in Embodiment 2 of the present invention.

The following description will discuss Embodiment 2 mainly with reference to FIG. 9 and (a) through (f) of FIG. 10.

Embodiment 2 mainly will describe points which are different from Embodiment 1. Components having functions identical to those in Embodiment 1 are given identical reference numerals/symbols, and descriptions of the respective components are omitted here.

Embodiment 1 has exemplified a case where the layer 71, made from a material that is attracted by a magnet, is formed on at least part of each of the chamber components 70, which at least part makes in contact with a vapor deposition material. Embodiment 2 will describe a case where a layer, made from a material that is attracted by a magnet, is formed on at least part of a chip-off tool for chipping off an attachment 22 from a chamber component 70, which at least part makes in contact with a vapor deposition material.

(Configuration of Attachment Collecting System)

FIG. 9 is a block diagram of an example configuration of an attachment collecting system employed in Embodiment 2.

As illustrated in FIG. 9, an attachment collecting system 300 employed in Embodiment 2 includes (i) a sandblasting device 210, (ii) a crusher 220, (iii) a filter 230, (iv) an attachment collecting device 240, (v) a conveying member 250 for conveying, to sections, collected materials 80 which have been clipped off from a surface of a chamber component 70 by the sandblasting device 210, and (vi) switching devices 260 for switching a conveying path (conveying direction).

Configurations of the respective sections will be described later, together with a method for collecting and recycling an attachment which has attached to a chamber component 70.

According to Embodiment 2, an attachment 22, which has attached to chamber components 70 such as a vapor deposition-proof plate 30 and a shutter 40, is exfoliated by use of a sandblast method that employs an abrasive, serving as the chip-off tool, which is made from a material that is attracted by a magnet.

According to the sandblast method, a surface of an object to be polished is chipped off and polished, by pneumatically colliding, with the surface, an abrasive (called sand) such as sand, alumina particles, or silicon carbide particles each having a diameter of approximately several hundreds of micrometer so that impulse force is applied to such a surface of the object to be polished. According to Embodiment 2, an abrasive, made from a material that is attracted by a magnet, is employed.

Note that a configuration of a vapor deposition device 1 employed in Embodiment 2 is the same as that employed in Embodiment 1. Note, however, that the chamber components 70, such as the vapor deposition-proof plate 30 and the shutter 40, are made from any materials in Embodiment 2.

(Collection and Recycling of Attachment which has Attached to Chamber Component 70)

The following description will discuss, with reference to (a) through (f) of FIG. 10, how an attachment 22, which has attached to a chamber component 70, is collected and recycled with the use of the attachment collecting system 300.

(a) through (f) of FIG. 10 are views illustrating steps of separating and collecting an attachment 22 in accordance with Embodiment 2.

As with Embodiment 1, prior to separating and collecting an attachment 22, a chamber component 70, to which the attachment 22 has attached, is first taken out of a vacuum chamber 10 after having been vapor-deposited several times (see (a) of FIG. 10).

With the use of the sandblasting device 210, an abrasive 212 is then blasted toward the attachment 22 via a nozzle 211 of the sandblasting device 210 (see (b) of FIG. 10) (attachment exfoliating process, exfoliating process).

This enables a mixture of (i) the abrasive 212 and (ii) the attachment 22 that has been exfoliated from the chamber component 70 to be collected (see (c) of FIG. 10).

The mixture thus collected (a collected material) is conveyed to the attachment collecting device 240 by the conveying member 250 such as a conveyer, as with Embodiment 1 (see, for example, (e) of FIG. 10).

(e) of FIG. 10 is a view schematically illustrating a configuration of a main part of the attachment collecting device 240 employed in Embodiment 2.

The attachment collecting device 240 employed in Embodiment 2 includes an immixed material collecting section 241 for separating and collecting, from the mixture of (i) the abrasive 212 and (ii) the attachment 22 that has been exfoliated from the chamber component 70, the abrasive 212 that is an immixed material (impurity) (see (e) of FIG. 10).

The above described conveyer, for example, is employed as the conveying member 250 which conveys the mixture (collected material) to the immixed material collecting section 241.

According to the immixed material collecting section 241, a magnet 241a, such as an electromagnet or a magnetic plate, is provided so as to come close to the conveying member 250.

The mixture (collected material) is placed on the conveying member 250 and is then conveyed toward the immixed material collecting section 241 by the conveying member 250 so as to pass through a magnetic field caused by the magnet 214a, while securing a space between the magnet 241a and the conveying member 250 (magnetic field passing process, separation process).

Since the abrasive 212 is made from a material that is attracted by a magnet, the abrasive 241a is attracted by the magnet 241a in the immixed material collecting section 241 (see (f) of FIG. 10). In contrast, the attachment 22 that is a vapor deposition material is not attracted by the magnet 241a.

The abrasive 212 and the attachment 22 can thus be separated from each other and separately collected, by causing the mixture to pass through the magnetic field.

As with Embodiment 1, note that the number of the magnetic field passing processes is not limited to once but can be more than once. The magnetic field passing process makes it possible to further increase purity of a finally collected attachment 22 (that is, purity of a finally collected vapor deposition material).

The mixture (collected material), before and/or after passing through the magnetic field, can selectively pass through the filter 230, which has openings 221 with a predetermined diameter, so as to be classified (see (d) of FIG. 10), if necessary. Since the switching devices 260 are employed so as to switch a direction (a path) in which the mixture is conveyed, the mixture can pass through the filter 230 (see FIG. 9). This makes it possible to separate in advance an abrasive 212 which is not small enough to pass through the filter 230. It is therefore possible to further increase the purity of the finally collected vapor deposition material.

In a case where the attachment 22, which has been exfoliated (detached) by the attachment exfoliating process, is larger than the openings 221 of the filter 230, a crushing step (milling step) of crushing the attachment 22 by use of the crusher 220 (mill) can be carried out (see FIG. 9).

In the crushing step, the abrasive 212, contained in the mixture (collected material) obtained in the attachment exfoliating process, can be employed, as it is, as a crushing member.

According to Embodiment 2, the attachment 22 is thus exfoliated (detached) from the surface of the chamber component 70, by use of the sandblast method. It is therefore possible to efficiently and sufficiently detach the attachment 22 from the surface of the chamber component 70 without any organic solvent.

Embodiment 2 has exemplified a case where the attachment 22 is chipped off from the chamber component 70 by use of the sandblast method which employs the abrasive, serving as the chip-off tool, which is made from a material that is attracted by a magnet.

However, Embodiment 2 is not limited to the case. The chip-off tool can be a tool, such as a scraper, a grinder or a polisher, which has at least part on which a layer, made from a material that is attracted by a magnet, is formed, which at least part makes in contact with a vapor deposition material.

(Material that is Attracted by Magnet)

As with Embodiment 1, the material that is attracted by a magnet is not limited to a specific one, provided that it is attracted by a magnet. Typical examples of the material that is attracted by a magnet include a ferromagnetic material (ferromagnet) and a ferrimagnetic material which are magnetic materials having a ferromagnetic part, as with Embodiment 1.

Note, however, that like Embodiment 2, in a case where the chip-off tool such as the abrasive is made from the material that is attracted by a magnet, iron, a ferromagnetic stainless steel, or other material is suitably employed as the material that is attracted by a magnet.

Further, as with Embodiment 1, the material that is attracted by a magnet, and the layer made from the material are preferably as hard as possible so that the material that is attracted by a magnet is neither exfoliated nor denaturalized in large quantity by the attachment exfoliating process.

The material that is attracted by a magnet, and the layer made from the material are preferably as hard as possible, from the viewpoint of decrease in mixed amount of parts detached (exfoliated) from the layer so that purity of a collected material which has been subjected to the magnetic field passing process (later described) is further increased. Moreover, as with Embodiment 1, a material to be used can be appropriately selected and adjusted in accordance with, for example, processability and material costs.

As with Embodiment 1, the layer, made from the material that is attracted by a magnet, is preferably a single layer so as to be collected and recycled.

In contrast, as with Embodiment 1, a base material layer of the chip-off tool is not limited to a specific one, and therefore can be a single layer or two or more layers. Furthermore, the base material layer can be made from a single material or two or more materials.

(Effect)

According to Embodiment 2, the attachment 22 is thus chipped off from the chamber component 70 by use of the chip-off tool which has the at least part on which the layer, made from the material that is attracted by a magnet, is formed, which at least part makes in contact with a vapor deposition material.

Therefore, even in a case where a fragment of the chip-off tool, which fragment has been chipped off together with the attachment 22 from the chamber component 70, is immixed in an exfoliated vapor deposition material, only the fragment can be separated and removed by thus causing a mixture of the fragment and the exfoliated vapor deposition material to pass through the magnetic field.

As with Embodiment 1, the mixture (collected material) which has been chipped off from the chamber component 70 is merely needed to pass through the magnetic field, as early described. It is therefore possible to separate and collect the attachment 22 simply and easily.

As with Embodiment 1, it is thus possible to collect and recycle a high purity vapor deposition material without any additional complicated separation process.

As with Embodiment 1, the abrasive 212, which has been attracted by the magnet 241a in the magnetic field passing process (separation process), can be collected and recycled. This makes it possible to (i) achieve a simple and easy recycling process, (ii) reduce the cost of recycling process and (iii) reduce wastes so as to alleviate environmental burdens.

As with Embodiment 1, no heat is applied to a vapor deposition material during collection of the vapor deposition material, and no water is used for the collection, either. Therefore, an effect identical to that of Embodiment 1 can be brought about.

(Modification)

Embodiment 2 can be combined with Embodiment 1. That is, for example, a layer, made from a material that is attracted by a magnet, can be formed on at least part of each of a chip-off tool and chamber components 70, which at least part makes in contact with a vapor deposition material.

In the Modification, a first material, that is attracted by a magnet, for the chamber components 70 can be different from a second material, that is attracted by a magnet, for the chip-off tool.

Note, however, that it is preferable that the first material and the second material are made from identical ferromagnetic materials, from the viewpoints of (i) recycling exfoliated parts of (a) the chip-off tool and (b) the chamber components 70 and (ii) eliminating the need for separating the first and second materials.

Embodiment 3

The following description will discuss Embodiment 3 mainly with reference to FIG. 11, and (a) and (b) of FIG. 12.

Embodiment 3 will mainly describe points which are different from Embodiments 1 and 2. Components having functions identical to those in Embodiment 1 are given identical reference numerals/symbols, and descriptions of the respective components are omitted here.

FIG. 11 is a cross-sectional view illustrating a layer structure of a chamber component employed in Embodiment 3. (a) and (b) of FIG. 12 are a view partially illustrating steps of exfoliating and collecting an attachment 22 in accordance with Embodiment 3.

Embodiment 3 is different from Embodiment 1 in that a chamber component 70 is configured so that a layer 71, made from a material, that is attracted by a magnet, such as a plate material made from a material which is attracted by a magnet, is attached to a base material 72 via an adhesive layer 73 (see FIG. 11).

Since the layer 71, made from a material, that is attracted by a magnet, such as a plate material made from a material which is attracted by a magnet, is thus attached to a base material 72 via an adhesive layer 73, it is possible to easily detach the plate material, to which an attachment 22 is attached, from the base material 72 (see (a) of FIG. 12).

According to Embodiment 3, a surface of the chamber component 70, in other words, the surface of the base material 72 will never be damaged. This enables the base material 72 to be reused as it is.

It is preferable that the plate member is made up of divided pieces so as to be easily taken out of the vacuum chamber 10.

The plate material, which has been taken out of the vacuum chamber 10 and to which surface the attachment 22 is attached, is crushed into pieces by use of, for example, a crusher. This allows the attachment 22 to be detached from the surface of the plate material (see (b) of FIG. 12).

It goes without saying that the attachment 22 can be chipped off from the surface of the plate material by the method described in Embodiment 1 or 2.

Only the pieces of the plate material can be separated and removed from a mixture of the pieces of the plate material and the attachment 22 by causing the mixture to pass through a magnetic field as in Embodiment 1 or 2.

As such, Embodiment 3 can bring about an effect identical to those of Embodiments 1 and 2.

Other Embodiment

In order to explain collection of a film forming material that is employed by a vacuum vapor deposition method, Embodiments 1 through 3 exemplified (i) a case where a vapor deposition material for use in production, by means of vacuum vapor deposition, of an organic EL display device is collected and (ii) a case where an organic material is collected.

A typical method for forming a film by means of vacuum vapor deposition is the above described vacuum vapor deposition method which employs a mask called shadow mask for vapor deposition.

The vacuum vapor deposition method is, as early described, generally employed in, for example, a film forming method for use in production of an organic EL display device.

However, Embodiments of the present invention are not limited to this, but are applicable to overall collection of a film forming material, that is not attracted by a magnet, which has attached to a component in a film forming chamber in a vacuum film forming device that employs a vacuum film forming method such as a vacuum vapor deposition method, a sputtering method, an ion plating method, or a CVD method.

The film forming material to be collected is limited to neither an organic material nor a specific material, provided that the film forming material can be separated, while passing through a magnetic field, from the above described material, which is attracted by a magnet, due to a difference in magnetism.

For example, ITO is employed as an electrically conductive film material for the first electrodes 121 and the second electrode 126 of the organic EL display device 100. ITO (i) has a high transmittance to visible light (a high transparency) and a small electric resistance (resistivity) and (ii) can be easily patterned by means of photo etching. ITO is therefore extensively employed as a transparent conductive film for, for example, (i) pixel electrodes and a common electrode of a liquid crystal panel, (ii) electrodes of a plasma display panel (PDP) or an organic or inorganic EL, (iii) an electromagnetic wave filter for PDP, (iv) a touch panel or (v) a solar battery.

Meanwhile, Indium contained in ITO is a metal called rare metal whose reserves is small, and an amount of Indium to be used has remarkably increased. It is therefore remarkably significant to collect and recycle ITO.

Examples of a method for forming a thin film of ITO encompass vacuum film forming methods such as a sputtering method, a vacuum vapor deposition method, and an ion plating method. For example, a transparent electrode, made from ITO, which is employed, for example, in a liquid crystal display is generally formed so as to be a thin film by use of the sputtering method.

On this account, it is remarkably significant to exfoliate and collect ITO that is a non-magnetic material in terms of increasing a material utilization rate, by use of the present invention.

(Summary)

A method of an embodiment of the present invention for collecting a film forming material is a method for collecting a film forming material by exfoliating a film forming material which has attached to a surface of a film forming jig provided in a film forming chamber of a vacuum film forming device, a layer, made from a material that is attracted by a magnet, being formed on at least part of the film forming jig, the at least part making in contact with the film forming material, the method including the steps of: (a) exfoliating the film forming material from the surface of the film forming jig; and (b) collecting the film forming material, by separating a fragment of the layer, which fragment has been exfoliated together with the film forming material in the step (a), while causing the fragment to be attracted by a magnet.

It is preferable to arrange the method such that in the step (a), the film forming material is exfoliated from the surface of the film forming jig, by chipping off the at least part by use of a chip-off tool having at least part which (i) is made from a material that is attracted by a magnet and (ii) makes in contact with the film forming material, and in the step (b), the film forming material is collected by separating (i) a fragment of the chip-off tool, which fragment is mixed in the film forming material which has been exfoliated in the step (a) and (ii) the fragment of the layer, which fragment has been exfoliated together with the film forming material in the step (a), while causing the fragment of the chip-off tool and the fragment of the layer to be attracted by the magnet.

A method of another embodiment of the present invention for collecting a film forming material is a method for collecting a film forming material by exfoliating a film forming material which has attached to a surface of a film forming jig provided in a film forming chamber of a vacuum film forming device, the method including the steps of: (a) exfoliating the film forming material from the surface of the film forming jig by use of a chip-off tool having at least part which (i) is made from a material that is attracted by a magnet and (ii) makes in contact with the film forming material; and (b) collecting the film forming material by separating a fragment of the chip-off tool from the film forming material, while causing the fragment to be attracted by the magnet, the fragment being (i) made from the material that is attracted by the magnet and (ii) mixed in the film forming material which has been exfoliated in the step (a).

According to the arrangements, the fragment made from the material that is attracted by a magnet, which fragment has been exfoliated together with the film forming material in the step (a), is attracted by the magnet to be separated from the film forming material. It is therefore possible to efficiently collect the film forming material at low cost.

Further, according to the methods, no complicated process such as (i) cleaning with a liquid solution or (ii) thermal treatment is carried out. Therefore, no additional impurity is immixed in the film forming material.

Therefore, according to the methods, a high purity film forming material can be collected and recycled without any additional complicated separation process.

The fragment which has been attracted by the magnet can be separated and collected by the step of (b). Such collection of the fragment will contribute to cost reduction and/or prevention of environmental destruction.

It is preferable to arrange the method such that the fragment of the chip-off tool is an abrasive made from a material that is attracted by a magnet, and in the step (a), the film forming material is exfoliated by use of a sandblasting method in which the abrasive is employed as the chip-off tool.

According to the arrangement, the film forming material which has attached to the film forming jig can be efficiently and sufficiently detached from the surface of the film forming jig.

It is preferable that the method includes the step of: (c) classifying part of the abrasive, which part does not pass through a filter, by filtering, before the step (b), a mixture of the film forming material and the abrasive which have been exfoliated in the step (a).

According to the method, purity of a finally collected film forming material can be improved.

It is preferable that the method includes the step of: (d) crushing, before the step (c), the film forming material contained in the mixture which has been obtained in the step (a).

According to the method, the film forming material can be crushed so as to pass through the filter.

It is preferable to arrange the method such that in the step (d), the film forming material is crushed with the abrasive contained in the mixture.

According to the method, the mixture of the film forming material and the abrasive, which has been obtained in the step (a), contains the abrasive. Therefore, the abrasive can be employed as a crushing member, as it is.

It is preferable to arrange the method such that in the step (b), a mixture of the film forming material and the fragment is caused to pass through, more than once, a magnetic field caused by the magnet.

According to the arrangement, purity of a finally collected film forming material can be improved.

Examples of the material, which is attracted by the magnet, encompass a ferromagnetic material and a ferromagnetic material.

It is preferable that the film forming material is an organic material for an organic electroluminescent element.

Generally, an organic material for an organic electroluminescent element is expensive, and therefore desirably collected and recycled. Further, generally, the organic material is not attracted by a magnet. Therefore, the organic material can be efficiently collected at low cost by the present invention.

The present invention is not limited to the description of the embodiments above, and can therefore be modified by a skilled person in the art within the scope of the claims. Namely, an embodiment derived from a proper combination of technical means disclosed in different embodiments is encompassed in the technical scope of the present invention.

INDUSTRIAL APPLICABILITY

The present invention is suitably applicable to collection of a film forming material which has attached to a surface of a film forming jig provided in a film forming chamber of a vacuum film forming device which employs a vacuum film forming method such as a vacuum vapor deposition method, a sputtering method, an ion plating method or a CVD method.

REFERENCE SIGNS LIST

1: vapor deposition device
10: vacuum chamber
11: inner wall
20: vapor deposition source
21: nozzle
22: attachment (film forming material)
30: vapor deposition-proof plate
31: first vapor deposition-proof plate
31a: opening
32: second vapor deposition-proof plate
32a: opening
40: shutter
50: mask
51: opening
60: film formation substrate
61: film formation surface
70: chamber component
71a: fragment
72: base material
73: adhesive layer
80: collected material
100: organic EL display device
101R, 101G, and 101B: pixel
110: TFT substrate
111: insulating substrate
112: TFT
113: electric wire
114: interlayer insulating film
114a: contact hole
115: edge cover
120: organic EL element
121: first electrode
122: hole injecting and transporting layer
123R, 123G, and 123B: luminescent layer
124: electron transporting layer
125: electron injecting layer
126: second electrode
130: adhesive layer
140: sealing substrate
200: attachment collecting device
201: conveyer
202: immixed material collecting section
202a: magnet
210: sandblasting device
211: nozzle
212: abrasive
220: crusher
221: opening
230: filter
240: attachment collecting device
241: immixed material collecting section
241a: magnet
250: conveying member
260: switching device
300: attachment collecting system

The invention claimed is:

1. A method for collecting a film forming material by exfoliating a film forming material which has attached to a surface of a film forming jig provided in a film forming chamber of a vacuum film forming device,
a layer, made from a material that is attracted by a magnet, being formed on at least part of the film forming jig, the at least part making in contact with the film forming material, and the film forming material being a material that is not attracted by a magnet,
said method comprising the steps of:
(a) exfoliating the film forming material from the surface of the film forming jig; and
(b) collecting the film forming material, by separating a fragment of the layer, which fragment has been exfoliated together with the film forming material in the step (a), while causing the fragment to be attracted by a magnet.

2. The method as set forth in claim 1, wherein:
in the step (a), the film forming material is exfoliated from the surface of the film forming jig, by chipping off the at least part by use of a chip-off tool having at least part which (i) is made from a material that is attracted by a magnet and (ii) makes in contact with the film forming material,
in the step (b), the film forming material is collected by separating (i) a fragment of the chip-off tool, which fragment is mixed in the film forming material which has been exfoliated in the step (a) and (ii) the fragment of the layer, which fragment has been exfoliated together with the film forming material in the step (a), while causing the fragment of the chip-off tool and the fragment of the layer to be attracted by the magnet.

3. The method as set forth in claim 2, wherein:
the fragment of the chip-off tool is an abrasive made from a material that is attracted by a magnet, and
in the step (a), the film forming material is exfoliated by use of a sandblasting method in which the abrasive is employed as the chip-off tool.

4. The method as set forth in claim 3, further comprising the step of:
(c) classifying part of the abrasive, which part does not pass through a filter, by filtering, before the step (b), a mixture of the film forming material and the abrasive which have been exfoliated in the step (a).

5. The method as set forth in claim 4, further comprising the step of:
(d) crushing, before the step (c), the film forming material contained in the mixture which has been obtained in the step (a).

6. The method as set forth in claim 5, wherein:
in the step (d), the film forming material is crushed with the abrasive contained in the mixture.

7. The method as set forth in claim 1, wherein:
in the step (b), a mixture of the film forming material and the fragment is caused to pass through, more than once, a magnetic field caused by the magnet.

8. The method as set forth in claim 1, wherein:
the material, that is attracted by the magnet, is a ferromagnetic material or a ferromagnetic material.

9. The method as set forth in claim 1, wherein:
the film forming material is an organic material for an organic electroluminescent element.

10. The method as set forth in claim 1, wherein the film forming material is ITO or an organic material that is not attracted by a magnet.

* * * * *